(12) United States Patent  (10) Patent No.: US 6,373,139 B1
Clark  (45) Date of Patent: Apr. 16, 2002

(54) LAYOUT FOR A BALL GRID ARRAY

(75) Inventor: Peggy L. Clark, Plantation, FL (US)

(73) Assignee: Motorola, Inc., Schaubmrug, IL (US)

( * ) Notice: Subject to any disclaimer, the term of this patent is extended or adjusted under 35 U.S.C. 154(b) by 0 days.

(21) Appl. No.: 09/413,705

(22) Filed: Oct. 6, 1999

(51) Int. Cl.[7] .............................................. H01L 23/52
(52) U.S. Cl. ........................ 257/774; 257/773; 257/737; 257/738; 257/772; 257/779; 257/780; 257/784; 361/777
(58) Field of Search ................................. 257/773, 774, 257/737, 738, 772, 779, 780, 784; 361/777

(56) References Cited

U.S. PATENT DOCUMENTS

| 5,241,133 A | 8/1993 | Mullen, III et al. ....... 174/52.4 |
| 5,784,262 A | * 7/1998 | Sherman ..................... 361/777 |

* cited by examiner

Primary Examiner—Steven Loke
Assistant Examiner—Luan Thai
(74) Attorney, Agent, or Firm—Frank M. Scutch, III

(57) ABSTRACT

A layout for a ball grid array (BGA) device (500) includes a set of solder ball pads (512) and a set of interconnection vias (510). Each one of said the set of interconnection vias (510) is coupled to a corresponding one of the solder ball pads (512). The interconnection vias (510) are laid out such that they provide for increased room for both vertical and horizontal traces (602, 702 and 802). With the BGA device (500) divided by an X-axis and a Y-axis to form four quadrants, two other axes V and W, are established rotated 45 degrees from the X and Y axes respectively. The solder pads (512) and interconnection vias (510) are on laid out on lines along or parallel to the V and W axes. The interconnection vias (510) in the four quadrants are located closer to the edge margins of the BGA device (500) than their corresponding solder ball pads (512).

6 Claims, 8 Drawing Sheets

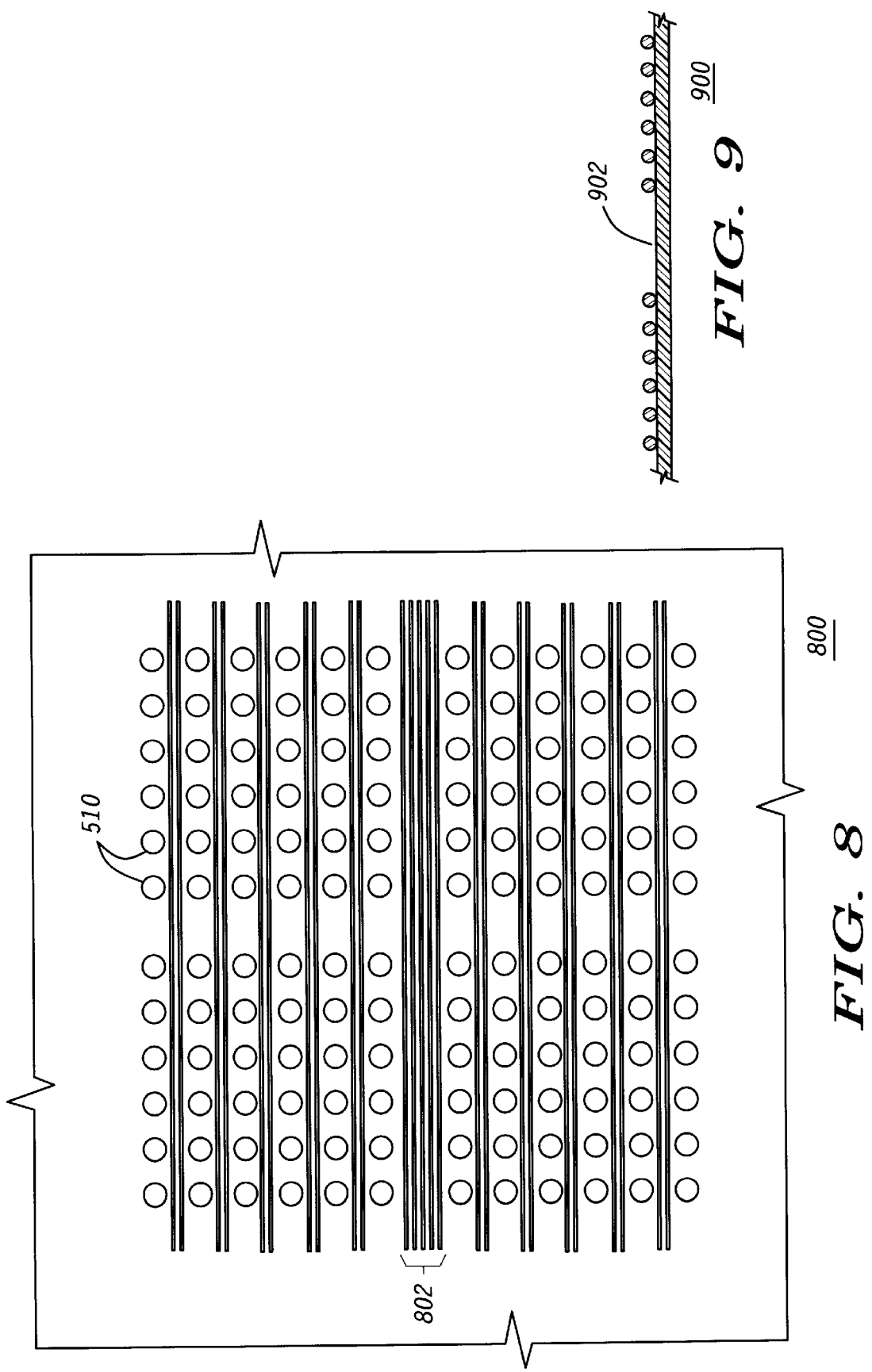

LAYOUT FOR A BALL GRID ARRAY

TECHNICAL FIELD

This invention relates in general to electrical devices, and more particularly, to a layout for a ball grid array device.

BACKGROUND

Because every solder ball pad on a surface mounted ball grid array (BGA) device needs an interconnection via, present layout techniques require routing around or using another printed circuit board (PCB) layer to route a signal trace from one side of a BGA package to the other. This present layout technique makes interconnection of BGA packages and surrounding components difficult.

Referring to FIG. 1, there is shown a BGA package 100 having a solder ball pad and interconnection via layout in accordance with the prior art. Multi-layer PCB's such as BGA package 100 are designed with horizontal (X-axis) and vertical (Y-axis) layers. Pads 102, the top pads, are designed to receive the solder balls for the BGA package, while interconnection vias 104 interconnect a specific solder ball pad 102 through the different PCB layers in the BGA package 100.

As shown in FIG. 1, the interconnection vias 104 are all set at the same 45° angle to the solder ball pads 102. FIGS. 2–4 show some of the inner PCB layers 200, 300, 400 and highlight the typical interconnect traces used with the prior art BGA package 100. As shown, using the same 45° angle for all of the interconnection vias 104 does not leave much room in the inner layers 200, 300 and 400 for routing traces. A need thus exists for a BGA package layout that helps improve the ability to route traces and may also help decrease the BGA board area and/or number of layers needed for the layout.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

FIGS. 5–8 highlight different board layout layers in accordance with the present invention.

FIG. 9 shows a partial side view of a BGA package in accordance with the present invention.

DETAILED DESCRIPTION OF THE PREFERRED EMBODIMENT

Figure 1:
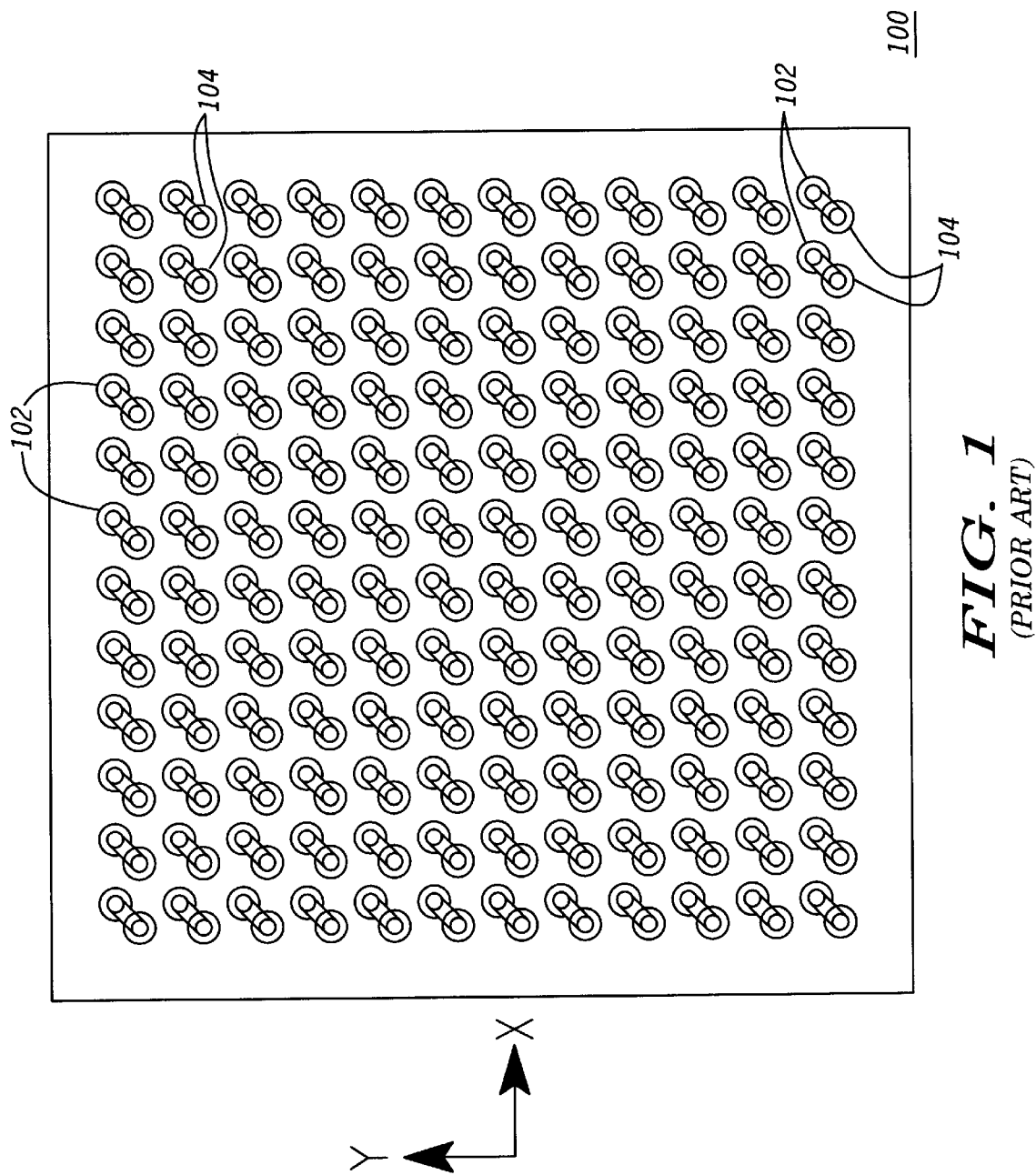
FIGS. 1–4 highlight the different board layout layers on a prior art BGA package.
Figure 2:
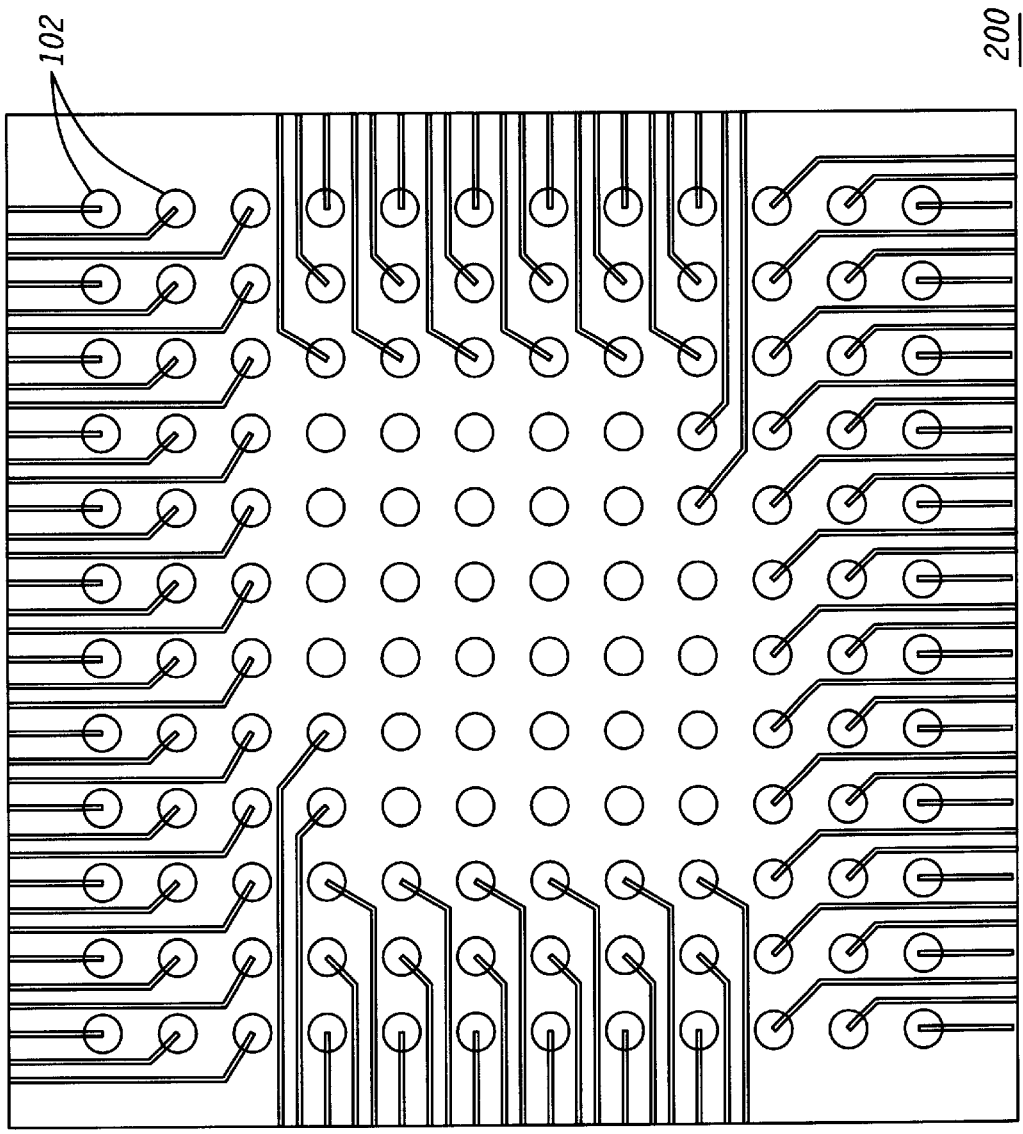
Figure 3:
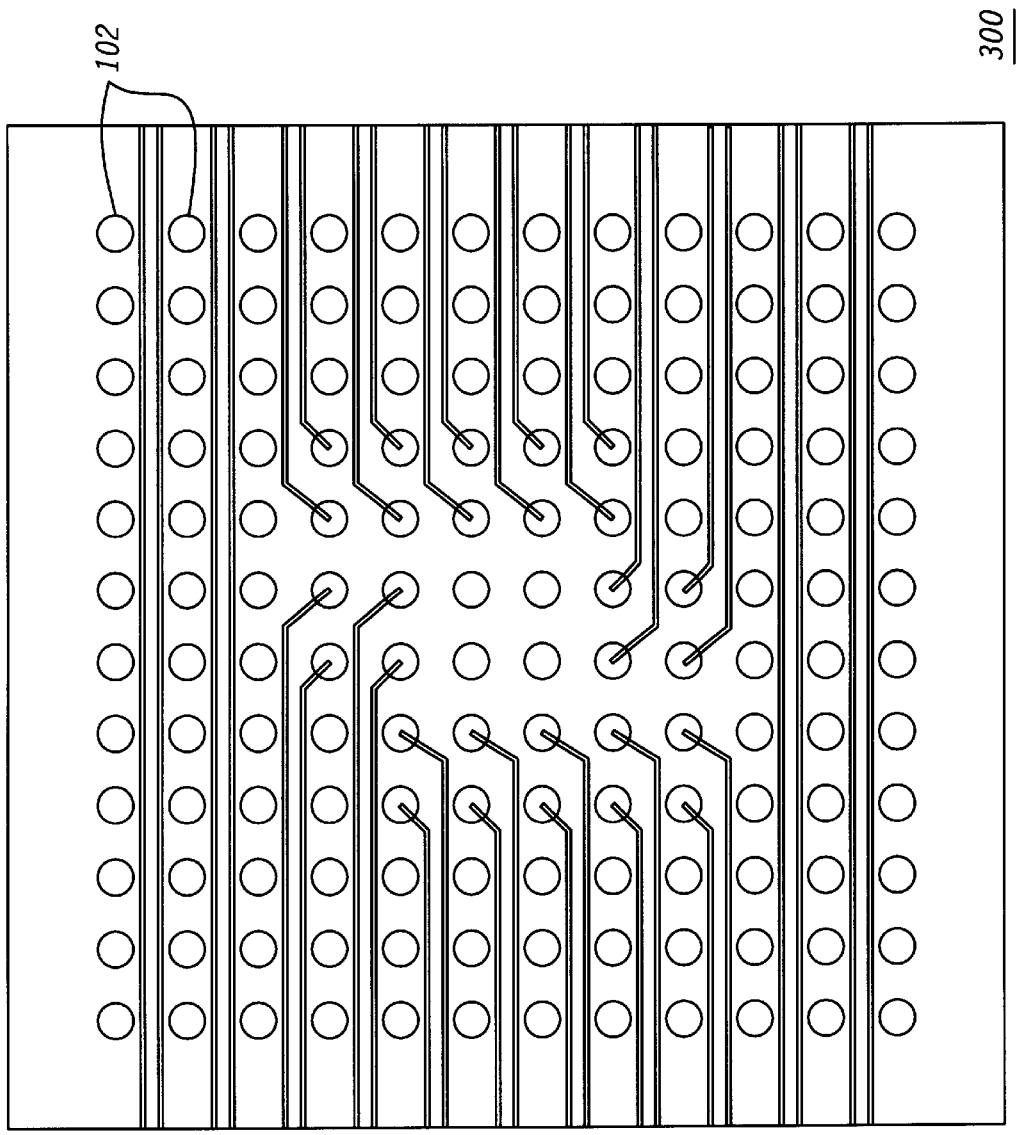
Figure 4:
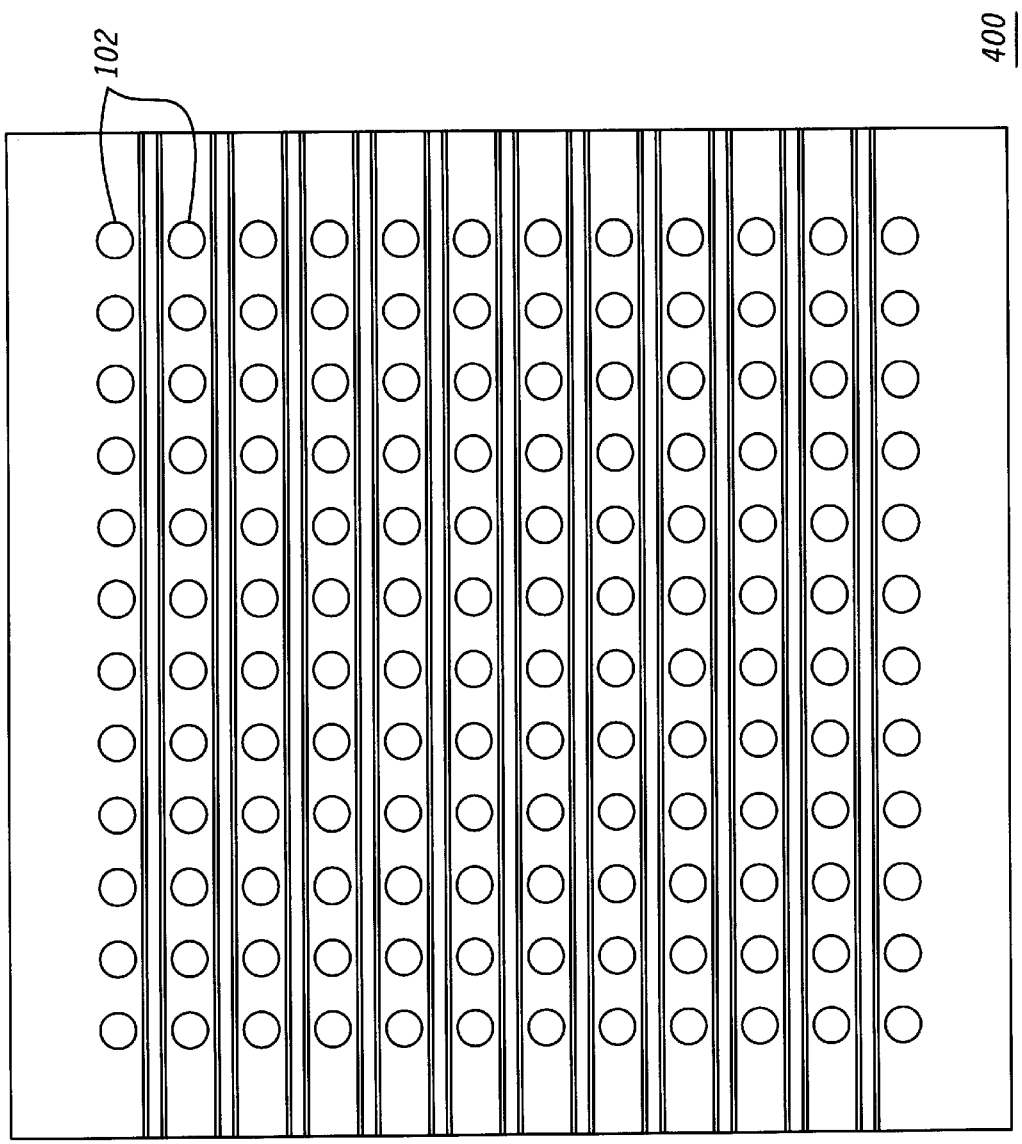

While the specification concludes with claims defining the features of the invention that are regarded as novel, it is believed that the invention will be better understood from a consideration of the following description in conjunction with the drawing figures, in which like reference numerals are carried forward.

Figure 5:
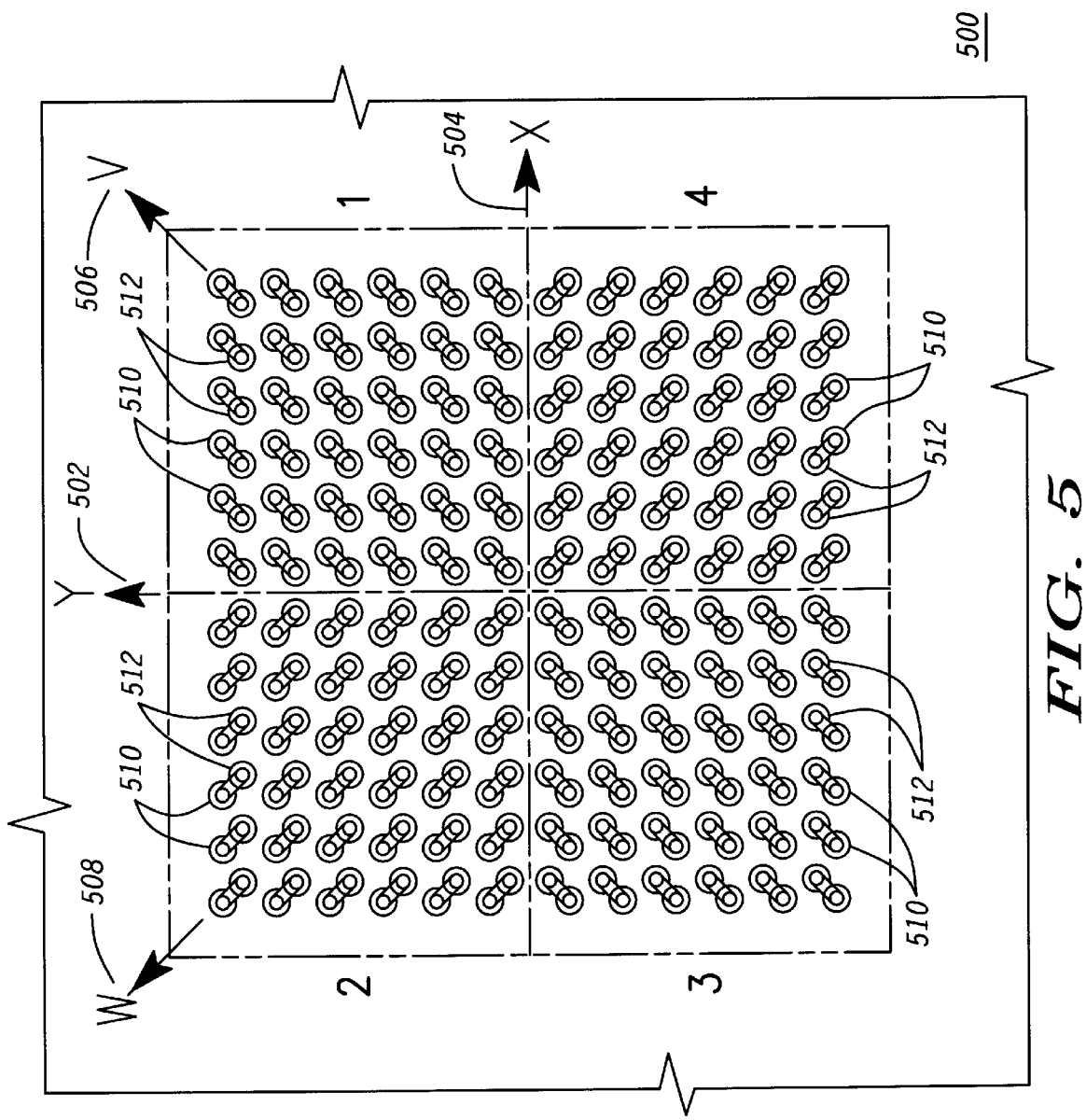

Referring now to FIG. 5, there is shown a BGA board 500 using the board layout technique of the present invention. As shown in FIG. 5, four quadrants labeled 1–4 are established using the X-axis 504 and Y-axis 502 intersect at the middle of the substrate and are orthogonal (intersect at a right angle). Two other axes, V-axis 506 and W-axis 508 are established and are rotated 45° from the X 504 and Y 506 axes, respectively. The interconnection vias 510 in quadrant 1 fan out in the positive V direction while those interconnection vias located in quadrant 3 fan out in the negative V direction.

In quadrant 2, the interconnection vias 510 fan out in the positive W direction (positive direction being above the X axis), while in quadrant 4 the interconnection vias 510 fan out in the negative W direction. Like in quadrants 1 and 3, the interconnection vias 510 in quadrants 2 and 4 fan out towards the edges or edge margins of the circuit substrate.

In accordance with the present invention, the solder ball pads 512 remain in the same location as those found in FIG. 1, however, the interconnect vias 510 which are electrically connected to the solder ball pads 512 are shifted depending on which quadrant 1–4 they are located in. The interconnect vias 510 and their corresponding solder ball pads 512 located in the $1^{st}$ and $3^{rd}$ quadrants run in pairs on lines along or parallel to the V 506 axis, while the interconnect vias 510/corresponding solder ball pad 512 pairs located in the $2^{nd}$ and $4^{th}$ quadrants run on lines along or parallel to the W 508 axis. With all of the interconnection vias 510 being located further away from the center of the BGA package (intersection of the X and Y axis or V and W axes) than their corresponding solder ball pads 512.

Figure 6:
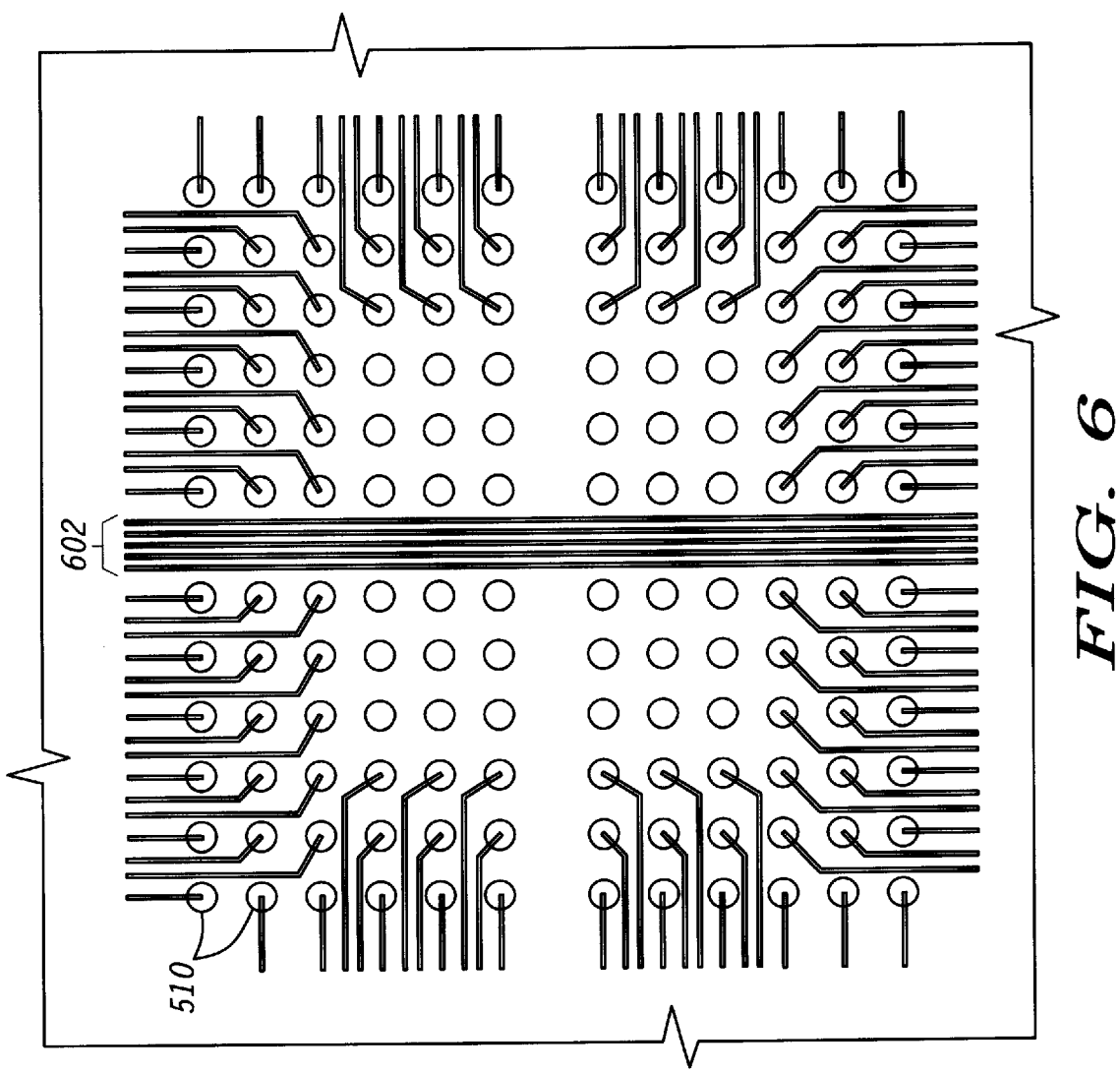
Figure 7:
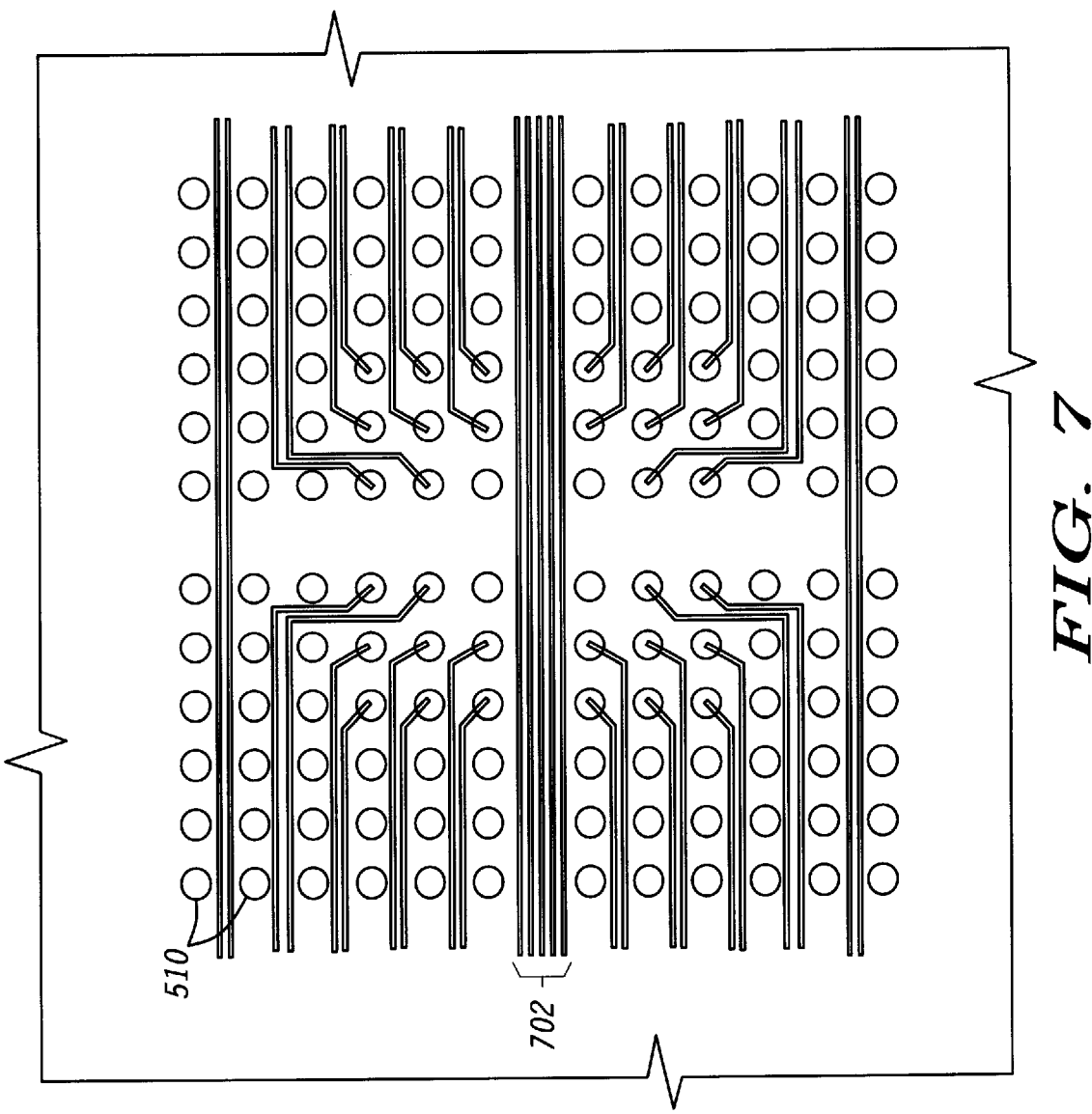

As shown specifically in FIG. 5, the interconnection vias 510 are located above their respective solder ball pads 512 in quadrants 1 and 2 (and below the solder ball pads 512 in quadrants 3 and 4. In each of the quadrants, the interconnection vias are located closer to the outer edge margins of the BGA package substrate than their corresponding solder ball pads 512. With the layout of the present invention, more room 602 is available for vertical traces in the inner layers of the package as shown in FIG. 6, and for horizontal traces 702 and 802 as shown in the inner layers of FIGS. 7 and 8.

In FIG. 9 there is shown a partial side view of a BGA device 900 in accordance with the invention. Each of the solder ball pads located on substrate 902 has a solder ball mounted to it as is well known in the art. The unique technique of laying out the corresponding interconnection vias 510 as disclosed above provides for extra space along the X and Y-axes in the inner layers as previously shown in FIGS. 6–8. This extra space provides for easier routing of interconnection traces and simplifies the time it takes to layout a BGA design as compared to the prior art.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A ball grid array device, comprising:
    a substrate having a plurality of edge margins;
    a plurality of solder ball pads located on the substrate;
    a plurality of interconnection vias electrically coupled one each to a corresponding one of the plurality of solder ball pads; and
    the substrate is divided into four uniformly aligned quadrants ($1^{st}$, $2^{nd}$, $3^{rd}$ and $4^{th}$ quadrants) by an X-axis and a Y-axis that intersect at the middle of the substrate and that are orthogonal to each other, and each one of the plurality of solder ball pads and their corresponding interconnection vias form pairs and the pairs are laid out uniformly along a plurality of lines which are at 45 degree angles to either the X or Y axes, and each one of the plurality of interconnection vias is located closer to the edge margins than its corresponding solder ball pad such that a gap is formed between each quadrant to facilitate placement of a plurality of interconnection traces.

2. A ball grid array device as defined in claim 1, wherein the substrate is further sub-divided by two other axes, a V-axis and a W-axis which are rotated 45 degrees from the X and Y axes respectively, and the plurality of interconnection vias are laid out such that:

the interconnection vias from amongst the plurality of interconnection vias and their corresponding solder ball pads located in the $1^{st}$ and $3^{rd}$ quadrants are laid out in lines along or parallel to the V-axis; and the interconnection vias from amongst the plurality of interconnection vias and their corresponding solder ball pads located in the $2^{nd}$ and $4^{th}$ quadrants are laid out in lines along or parallel to the W-axis.

3. A ball grid array as defined in claim 1, wherein the substrate comprises a multi-layer substrate.

4. A ball grid array device, comprising:

a substrate;

a plurality of solder ball pads located on the substrate;

a plurality of interconnection vias electrically coupled one each to a corresponding one of the plurality of solder ball pads; and the plurality of interconnection vias and solder ball pads are uniformly laid out such that when an X-axis and Y-axis orthogonal to each other are drawn to divide the substrate into four uniformly aligned equal quadrants, all of the plurality of interconnection vias and their corresponding solder ball pads located in each of the quadrants are laid out such that each one of the plurality of interconnection vias and corresponding solder ball pad are laid out as pairs along lines that are parallel to each other and that are at 45 degree angles from either the X or Y axes, and each of the plurality of interconnection vias are located further from the intersection of the X and Y axes than their corresponding solder ball pads such that a gap is formed between each quadrant to facilitate placement of a plurality of interconnection traces.

5. A ball grid array device as defined in claim 4, wherein the substrate comprises a multi-layer substrate.

6. A ball grid device as defined in claim 4, wherein the substrate is further sub-divided by two other axes, a V-axis and a W-axis which are rotated 45 degrees from the X and Y axes respectively, and the plurality of interconnection vias are laid out such that:

the interconnection vias from amongst the plurality of interconnection vias and their corresponding solder ball pads located in the $1^{st}$ and $3^{rd}$ quadrants are laid out in pairs on lines along or parallel to the V-axis; and the interconnection vias from amongst the plurality of interconnection vias and their corresponding solder ball pads located in the $2^{nd}$ and $4^{th}$ quadrants are laid out in pairs on lines along or parallel to the W-axis.

\* \* \* \* \*